United States Patent
Yeh et al.

(10) Patent No.: US 6,801,453 B2
(45) Date of Patent: Oct. 5, 2004

(54) METHOD AND APPARATUS OF A READ SCHEME FOR NON-VOLATILE MEMORY

(75) Inventors: Chih-Chieh Yeh, Taipei (TW); Wen-Jer Tsai, Hualien (TW); Tao-Cheng Lu, Kaohsiung (TW)

(73) Assignee: Macronix International Co., Ltd., Hsin-Chu (TW)

( * ) Notice: Subject to any disclaimer, the term of this patent is extended or adjusted under 35 U.S.C. 154(b) by 183 days.

(21) Appl. No.: 10/112,871

(22) Filed: Apr. 2, 2002

(65) Prior Publication Data

US 2003/0185052 A1 Oct. 2, 2003

(51) Int. Cl.[7] .............................................. G11C 16/04
(52) U.S. Cl. ........................ 365/185.18; 365/185.26
(58) Field of Search ........................ 365/185.18, 185.08, 365/185.28, 185.27, 185.33, 185.02, 185.11

(56) References Cited

U.S. PATENT DOCUMENTS

| | | | |
|---|---|---|---|
| 5,644,533 A | * 7/1997 | Lancaster et al. | 365/185.18 |
| 5,768,192 A | 6/1998 | Eitan | |
| 5,822,243 A | * 10/1998 | Shone | 365/185.08 |
| 6,272,050 B1 | * 8/2001 | Cunningham et al. | 365/185.28 |

* cited by examiner

Primary Examiner—David Nelms
Assistant Examiner—Thinh T. Nguyen
(74) Attorney, Agent, or Firm—Birch, Stewart, Kolasch & Birch, LLP

(57) ABSTRACT

A method of a read scheme for a non-volatile memory cell. The non-volatile memory cell includes a substrate, a source, a drain and a gate above a channel separated by a nonconducting charge trapping material sandwiched between first and second insulating layers. The method applies a first positive drain-to-source bias, a second positive source-to-substrate bias, and a third positive gate-to-source bias to read the source-side charges trapped in the trapping material near the source side.

8 Claims, 3 Drawing Sheets

METHOD AND APPARATUS OF A READ SCHEME FOR NON-VOLATILE MEMORY

BACKGROUND OF THE INVENTION

1. Field of the Invention

The present invention relates generally to semiconductor memory devices and more particularly to a read scheme for a programmable read only memory (PROM) cell having charge trapping dielectric material in the gate.

2. Description of the Related Art

Memory devices for non-volatile storage of information are currently in widespread use today, being used in a myriad of applications, such as portable communication systems.

U.S. Pat. No. 5,768,192, issued to Eitan et al., teaches an apparatus for and method of programming and reading a programmable read only memory (PROM) having a trapping dielectric layer sandwiched between two silicon dioxide layers, as shown in FIG. 1. FIG. 1 illustrates a sectional view of a PROM cell constructed in accordance with Eitan's reference utilizing ONO as the gate dielectric. The PROM can be programmed to let electrons trapped in both sides of the silicon nitride layer 20 near the source 14 and the drain 16 (i.e. 2 bits/cell operation).

To sense or read the source 14 side charges, voltages are applied to the gate and the drain 16 while the source 14 and the substrate are ground, wherein the gate voltage is 3V and the drain voltage is 1.5V. In other words, the drain-to-substrate bias is 1.5V, the source-to-substrate bias is 0V, and the drain-to-source bias is 1.5V. The voltages for the drain 16 and the source 14 can be interchanged to read the drain side charges. The current for reading the source side charges, for example, might be influenced by the drain side charges. The more area that the depletion region of the drain-to-substrate junction covers the substrate surface under the drain side charges, the more stable the read current.

Larger drain-to-substrate bias is capable of extending the depletion region to cover more area under the trapped charges at the drain side. The larger depletion region avoids the trapped electrons interfering with the read current and makes the read current stable. Therefore, an instinct solution to provide a higher drain voltage. However, read disturb is caused when the drain-to-source bias is too large to make the amount of the drain side charges stable because of higher lateral electric field. That means that, after reading source side charges several times, the drain side charges, or the data stored at the drain side, might be unexpectedly changed.

SUMMARY OF THE INVENTION

The object of the present invention is to provide a read scheme for a non-volatile memory that can read the trapped charges at one side while has less influence from those at the other side.

Another object of the present invention is to avoid read disturb during reading the non-volatile memory.

To achieve the above-mentioned object, the present invention provides a method of a read scheme for a non-volatile memory cell. The non-volatile memory cell has a substrate, a first source/drain, a second source/drain with a channel region therebetween, and a gate. The gate is located above the channel region separated therefrom by a nonconductive charge trapping material sandwiched between first and second insulating layers. The method comprises the steps of applying a first positive bias across the first source/drain and the substrate, applying a second positive bias across the second source/drain and the first source/drain, and applying a third positive bias across the gate and the first source/drain.

In addition, the present invention provides a method of a read scheme for a non-volatile memory cell. The non-volatile memory cell has a substrate, a first source/drain, a second source/drain and a gate. The gate is located above a channel region separated therefrom by a silicon nitride layer sandwiched between first and second silicon oxide layers. The method comprises the steps of applying a first voltage to the first source/drain, applying a second voltage to the second source/drain, applying a third voltage to the gate, and applying a fourth voltage to the substrate. The first voltage is higher than the second voltage, and the second and third voltages are higher than the fourth voltage.

BRIEF DESCRIPTION OF THE DRAWINGS

The present invention will become more fully understood from the detailed description given hereinbelow and the accompanying drawings, given by way of illustration only and thus not intended to be limitative of the present invention.

DETAILED DESCRIPTION OF THE PREFERRED EMBODIMENT

First Embodiment

Figure 1:
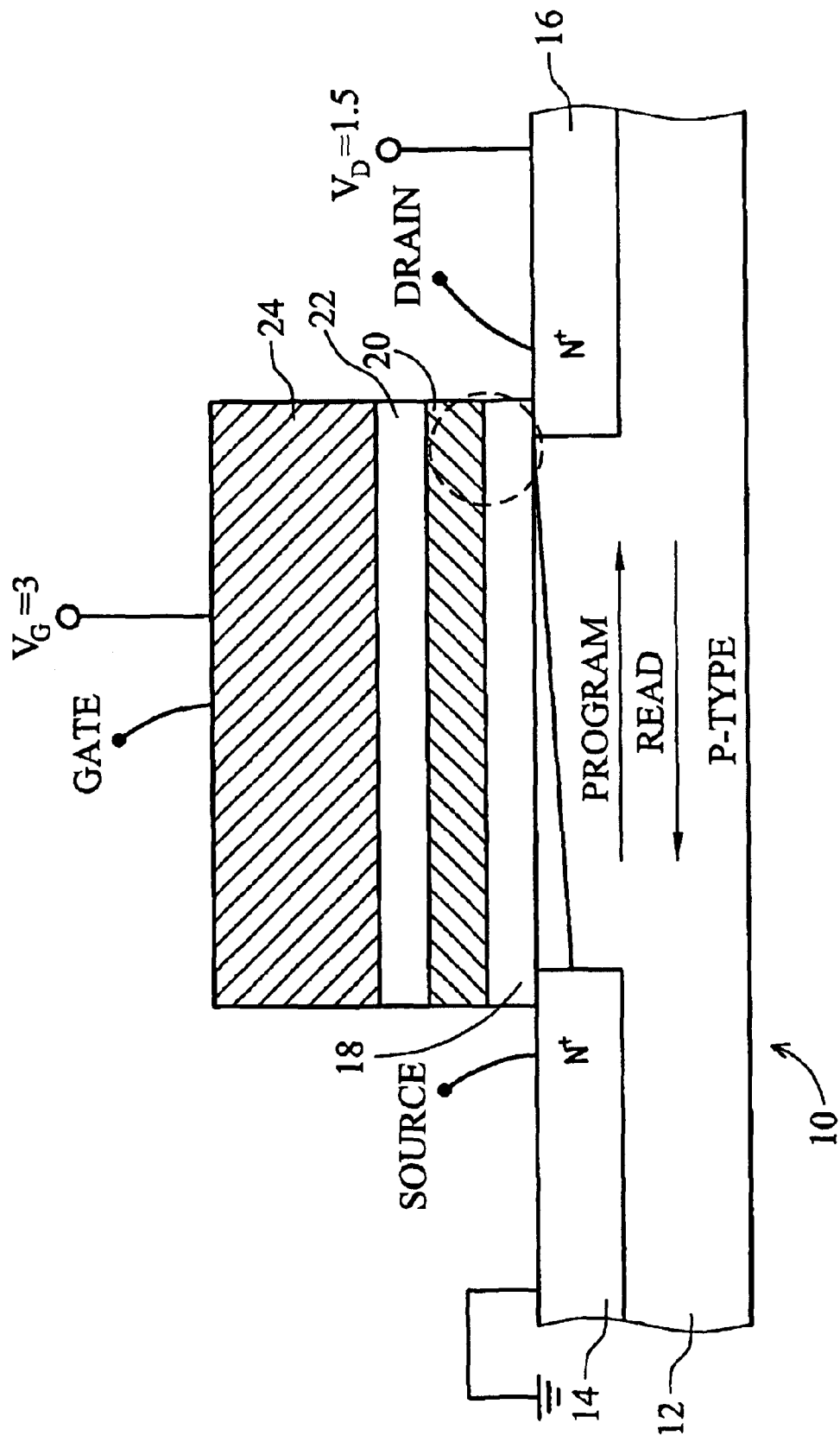
FIG. 1 illustrates a sectional view of a PROM cell constructed in accordance with Eitan's reference utilizing ONO as the gate dielectric.
Figure 2:
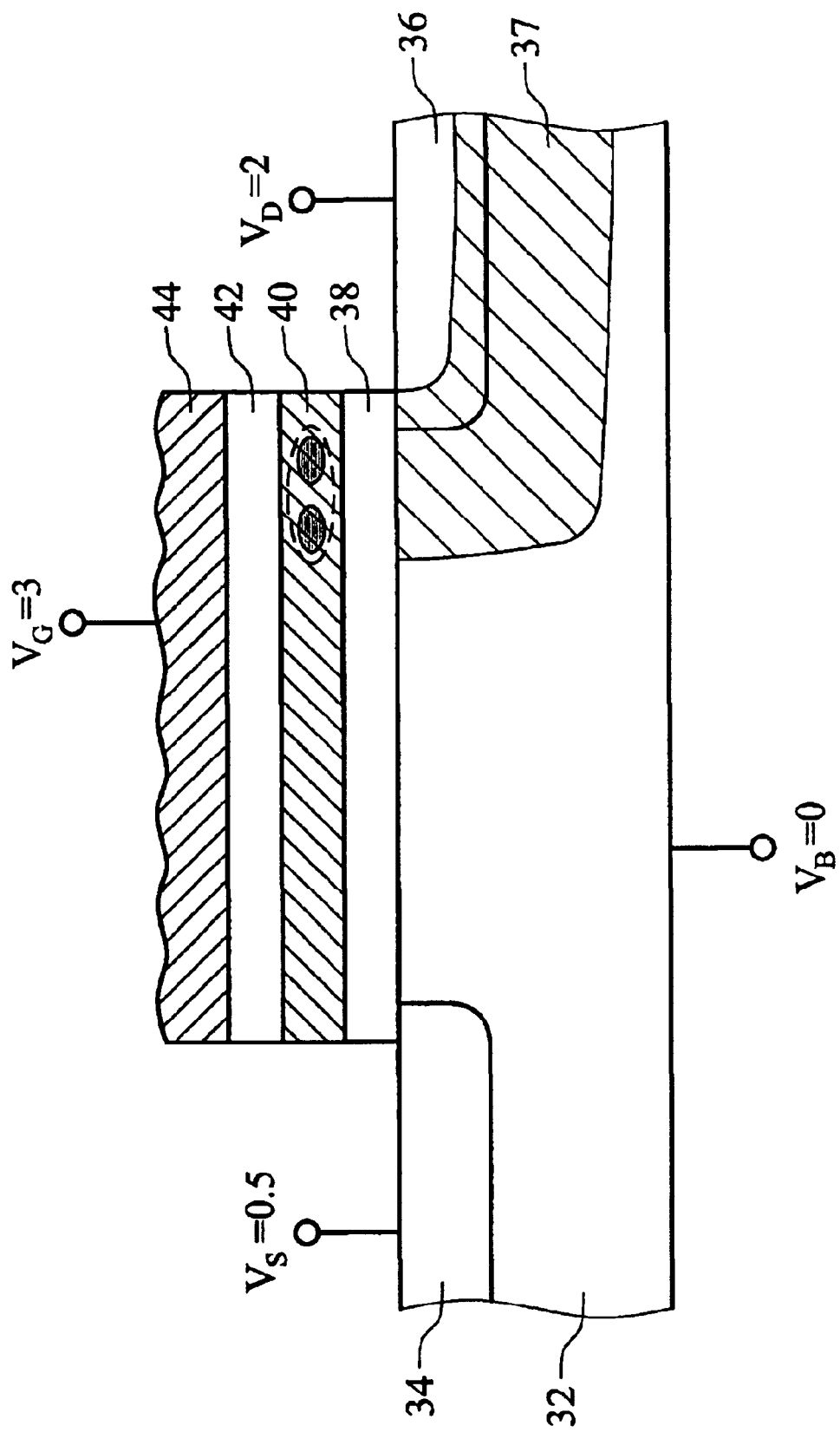
FIG. 2 illustrates a sectional view of a PROM cell constructed in accordance with the first embodiment of the present invention.

FIG. 2 illustrates a sectional view of a PROM cell constructed in accordance with the first embodiment of the present invention.

A P-type substrate 32 has two buried N+ junctions separated by a channel region, one being the source 34 and the other being the drain 36. Above the channel region is a layer of silicon dioxide 38, preferably between approximately 80–100 angstroms thick, which forms an electrical isolation layer over the channel. On top of the silicon dioxide layer 38 is a silicon nitride layer 40 preferably approximately 100 angstroms thick. This silicon nitride 40 layer forms the memory retention layer functioning to trap the hot electrons as they are injected into the nitride layer 40. Another layer of silicon dioxide 42 is formed over the silicon nitride layer 40 and is preferably between approximately 80–100 angstroms thick. The silicon dioxide layer 42 functions to electrically isolate a conductive gate 44 formed over the silicon dioxide layer 42. The layer forming the gate 44 can be constructed from polycrystalline silicon, commonly known as polysilicon.

When the drain side of the PROM memory cell is programmed, voltages are applied to the gate 44 and drain 36 creating vertical and lateral electrical fields, which accelerate the electrons along the length of the channel. As the electrons move along the channel some of them gain sufficient energy to jump over the potential barrier of the bottom silicon dioxide layer 38 and become trapped in the silicon nitride layer 40. The electron trapping occurs in a region near the drain indicated by the dashed circle in FIG. 2. Electrons are trapped near the drain region 36 because the electric fields are the strongest there, thus the electrons have a maximum probability of being sufficiently energized to jump the potential barrier and become trapped in the nitride layer 40. The threshold voltage of the portion of the gate over the trapped charge increases as more electrons are injected into the nitride layer. The voltages applied to the drain and the source to program the drain side can be interchanged to program the source side of the PROM memory cell.

Because the silicon nitride layer 40 is not conductive material, the electrons can be trapped in destined regions, such as the portions of the silicon nitride layer 40 near the source 34 and the drain 36. The memory cell of the invention is capable of storing more than one bit data.

The device is read in the opposite direction from which it was written. For example, to read the source side charges, the gate 44, the drain, the source and the substrate, for example, are respectively biased at 3V, 2V, 0.5V and 0V. Drain-to-source bias, equal to 1.5V in this embodiment, is positive such that electron current flows from the source side to the drain side. The gate-to-source bias, 2.5V, and the source-to-substrate bias, 0.5V, are also positive. Applying to 0.15 um PROM that has a channel length of 0.3 um, the drain-to-source bias is preferably between about 0.5V to 3V, the source-to-substrate bias between about 0.1V to 1.5V, and the gate-to-source bias between about 0.5V to 6V.

To read the drain side charges, the gate voltage and the substrate voltage are not changed while the drain voltage and the source voltage are interchanged or the drain-to-source bias is reversed.

All the voltages required for reading, programming or erasing the PROM memory cell in FIG. 2 can be provided from peripheral circuits, such as a row decoder and a column decoder.

In comparison with the mentioned prior art, whose drain-to-substrate bias is only 1.5V, the drain-to-substrate bias of this embodiment is 2V, which is larger and extends the depletion region of the drain-to-substrate junction to cover more surface area of the substrate under the trapped charge region at the drain side. The read current of this embodiment, as a result, becomes less sensitive to the drain side charges. The drain-to-source bias of this embodiment, which controls the strength of the lateral electric field in the surface channel and strongly affects the amount of hot electrons at the drain side, is 1.5V (2V–0.5V), the same as that mentioned in the prior art. In other words, the possibility of read disturb for this embodiment is not increased and a more stable read current is obtained.

Second Embodiment

Figure 3:
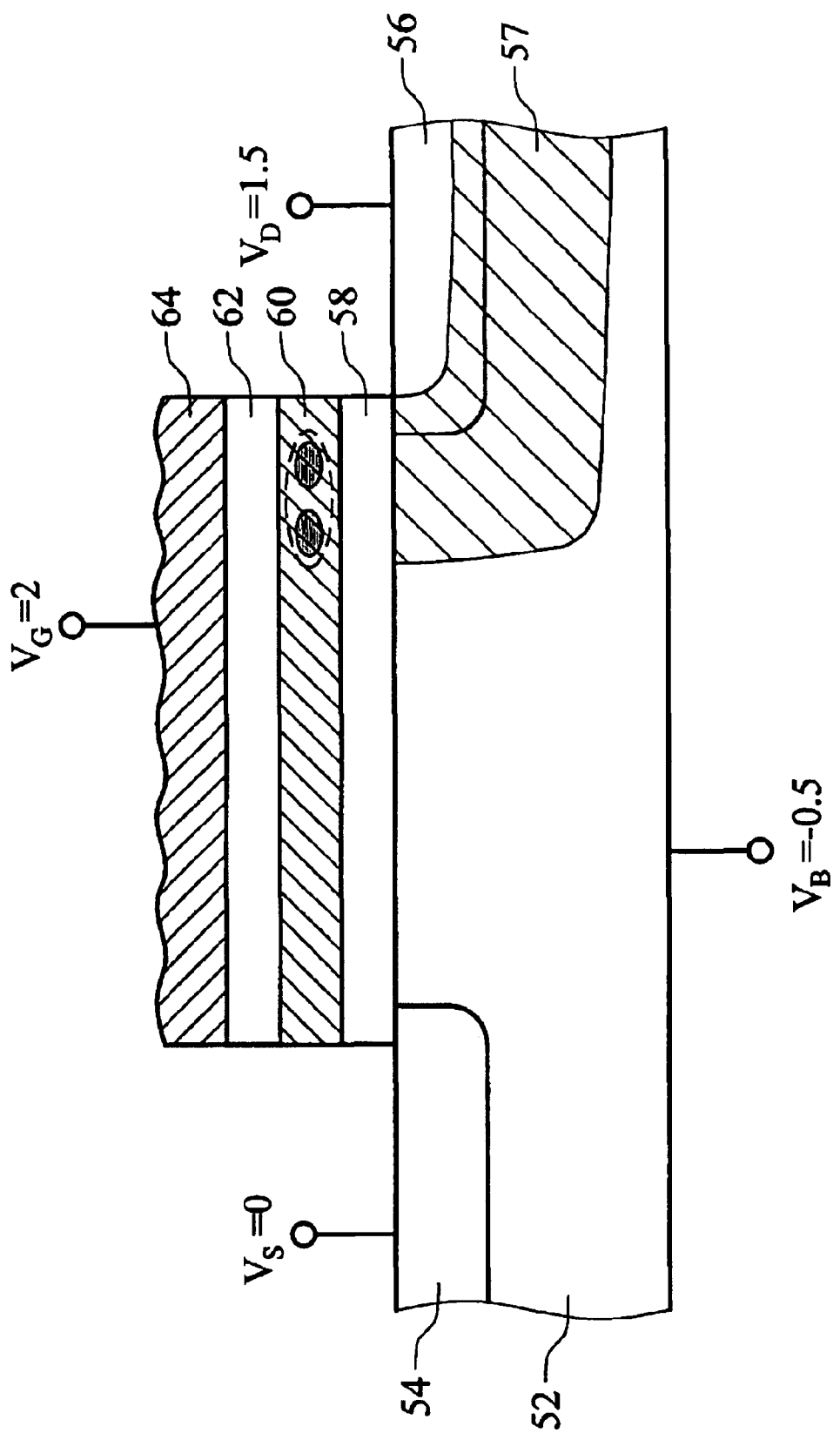
FIG. 3 illustrates a sectional view of a PROM cell constructed in accordance with the second embodiment of the present invention.

FIG. 3 illustrates a sectional view of a PROM cell constructed in accordance with the second embodiment of the present invention.

As well known in the art, voltage at a certain terminal means nothing if it does not compare with that at another terminal. Therefore, there are uncountable voltage combinations for two terminals to meet a bias requirement. FIG. 3 shows another voltage combination that meets the same bias conditions in FIG. 2. In FIG. 3, the voltages for drain, source, gate and substrate are respectively 1.5V, 0V, 2.5V and –0.5V. It is easy for those in the art to derive that the drain-to-source bias is 1.5V, the source-to-substrate bias 0.5V, and the gate-to-source 2.5V. The generic voltage combination to meet the same biases in FIGS. 3 and 4 is shown in the following equation:

$$\{\text{drain voltage, source voltage, gate voltage, substrate voltage}\} = \{(X+1.5)V, (X+0)V, (X+2.5)V, (X-0.5)V\}.$$

X is a nature number.

The foregoing description of the preferred embodiments of this invention has been presented for purposes of illustration and description. Obvious modifications or variations are possible in light of the above teaching. The embodiments were chosen and described to provide the best illustration of the principles of this invention and its practical application to thereby enable those skilled in the art to utilize the invention in various embodiments and with various modifications as are suited to the particular use contemplated. All such modifications and variations are within the scope of the present invention as determined by the appended claims when interpreted in accordance with the breadth to which they are fairly, legally, and equitably entitled.

What is claimed is:

1. A method of a read scheme for a non-volatile memory cell, the non-volatile memory cell having a substrate, a first source/drain, a second source/drain with a channel region therebetween, and a gate above the channel region separated therefrom by a nonconductive charge trapping material sandwiched between first and second insulating layers, the method comprising the following steps:

applying a first positive bias across the first source/drain and the substrate;

applying a second positive bias across the second source/drain and the first source/drain; and applying a third positive bias across the gate and the first source/drain.

2. The method of a read scheme for a non-volatile memory cell as claimed in claim 1, wherein the first positive bias is between about 0.1V and 1.5V.

3. The method of a read scheme for a non-volatile memory cell as claimed in claim 1, wherein the second positive bias is between about 0.5V and 3V.

4. The method of a read scheme for a non-volatile memory cell as claimed in claim 1, wherein the third positive bias is between about 0.5V and 6V.

5. A method of a read scheme for a non-volatile memory cell, the non-volatile memory cell having a substrate, a first source/drain, a second source/drain with a channel region therebetween, and a gate above the channel region separated therefrom by a silicon nitride layer sandwiched between first and second silicon oxide layers, the method comprising the following steps:

applying a first voltage to the first source/drain;

applying a second voltage to the second source/drain;

applying a third voltage to the gate; and applying a fourth voltage to the substrate;

wherein the first voltage is higher than the second voltage, and the second and third voltages are higher than the fourth voltage.

6. The method of a read scheme for a non-volatile memory cell as claimed in claim 5, wherein the difference between the first and the second voltage is between about 0.5V and 3V.

7. The method of a read scheme for a non-volatile memory cell as claimed in claim 5, wherein the difference between the second and the fourth voltage is between about 0.1V and 1.5V.

8. The method of a read scheme for a non-volatile memory cell as claimed in claim 5, wherein the difference between the third and the second voltage is between about 0.5V and 6V.

* * * * *